United States Patent [19]

Hochstein et al.

[11] Patent Number: 4,483,016

[45] Date of Patent: Nov. 13, 1984

[54] AUDIO AMPLIFIER

[76] Inventors: Peter A. Hochstein, 14020 Fifteen Mile Rd., Sterling Heights, Mich. 48077; Kelvin Shih, 908 Devonshire Rd., Brighton, Mich. 48116

[21] Appl. No.: 422,260

[22] Filed: Sep. 23, 1982

[51] Int. Cl.³ ............................................. H03F 3/16
[52] U.S. Cl. .................................... 381/120; 330/264
[58] Field of Search ............... 330/264, 253, 255, 269; 381/120

[56] References Cited

U.S. PATENT DOCUMENTS

| | | | |
|---|---|---|---|
| 3,601,712 | 8/1971 | Elazer | 330/24 |
| 3,872,390 | 3/1975 | Nash | 330/264 |
| 3,924,070 | 12/1975 | Seaver | 179/1 VC |
| 4,015,212 | 3/1977 | Miyata | 330/264 |
| 4,031,482 | 6/1977 | Tsurushima | 330/264 |
| 4,100,502 | 7/1978 | Yamashiro | 330/264 |
| 4,184,124 | 1/1980 | Asakawa | 330/264 |
| 4,194,165 | 3/1980 | Skulski | 84/1.16 X |
| 4,352,073 | 9/1982 | Leuthold | 330/264 |
| 4,390,851 | 6/1983 | Higgins et al. | 230/277 |

Primary Examiner—Gene Z. Rubinson
Assistant Examiner—James L. Dwyer
Attorney, Agent, or Firm—Harold W. Milton, Jr.

[57] ABSTRACT

An amplifier circuit for a speaker 12. The circuit includes an operational amplifier 16 connected to a supply rail 24 and a supply rail 26 through a regulator 28 and a regulator 30. The circuit is characterized by a P channel MOS-FET 32 having a source 34 connected to the rail 24 and a drain 36 connected to the speaker 12 and a gate 38, and an N channel MOS-FET 40 having a source 42 connected to the rail 26 and a drain 44 connected to the speaker 12 and a gate 46. A NPN stage 48 is responsive to the output 56 of the amplifier 16 for establishing a voltage differential between the gate 38 of the MOS-FET 32 and the rail 24 to drive the MOS-FET 32 into conduction. A PNP stage 50 is responsive to the output 56 of the amplifier 16 for establishing a voltage differential between the gate 46 of the MOS-FET 40 and the rail 26 to drive the MOS-FET 40 into conduction. The stages 48, 50 are connected to ground 52. A feedback circuit 94 interconnects the drain 36 of the MOS-FET 32 and the ground 52 side of the stage 48, and a feedback circuit 96 interconnects the drain 44 of the MOS-FET 40 and the ground 52 side of the stage 50. A feedback circuit 98 interconnects the speaker 12 and the amplifier 16 for returning a portion of the output voltage to the amplifier 16 to cause the output signal to track the signal at the input to the amplifier 16. A PNP transistor 68 has its base 72 connected to the source 34 of the MOS-FET 32 and its emitter 70 connected to the rail 24 and its collector 76 connected to the output 12, and an NPN transistor 82 has its base 84 connected to the source 42 of the MOS-FET 40 and its emitter 87 connected to the rail 24 and its collector 90 connected to the output 12.

27 Claims, 1 Drawing Figure

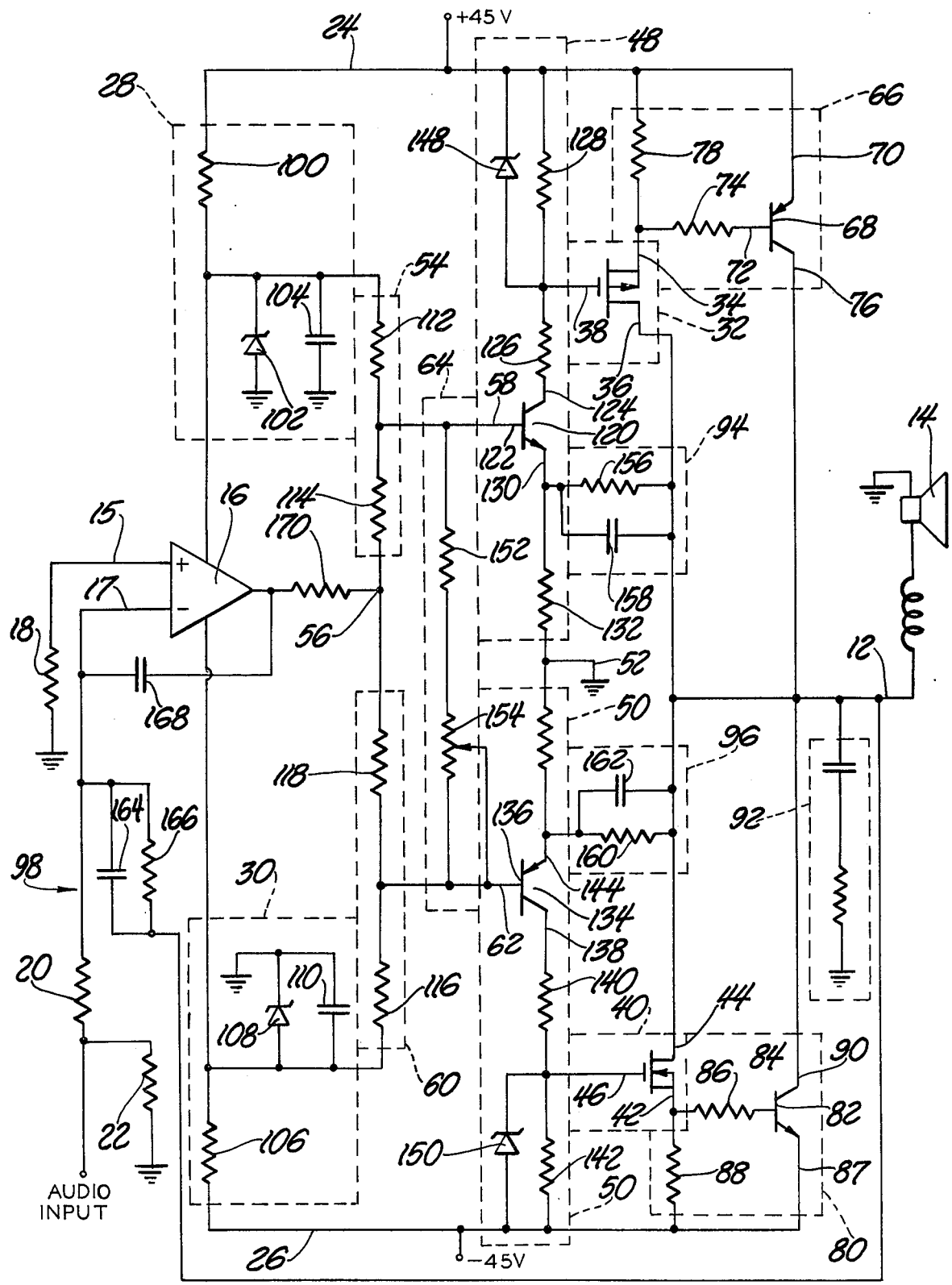

AUDIO AMPLIFIER

TECHNICAL FIELD

The subject invention relates to a high power, high performance, solid state, audio power amplifier.

BACKGROUND ART

Typical high performance amplifiers use either straight class A, active bias class A, or type AB output stages. The high quiescent idling power of conventional class A amplifiers requires expensive, high capacity cooling provisions for the output stages. Active biasing schemes are available wherein the average signal level sets the class A idling current to reduce the heat dissipation requirements of high power, class A systems. In many instances, the class AB systems are desirable because the steady state dissipation is kept to a reasonably low fraction of the rated output powder thereby reducing the heat dissipation requirement.

An important consideration in the design of either class A or class AB output stages is the thermal-runaway effect associated with bipolar transistors. As is well known, the base-emitter voltage drop of a bipolar transistor decreases with temperature ($-2.4$ mV/° C.) thereby increasing the collector-emitter current through the device. Naturally, the self-heating in the transistor increases with increased current flow, which, in turn, further decreases the base-emitter voltage drop, leading to thermal-runaway. Consequently, without adequate heat dissipation means, such as an adequate heat sink, or independent negative thermally induced feedback which could act as a thermal protection circuit, such output stages are notoriously known to self-destruct when driven to high output levels at high ambient temperatures. Active current limiting circuits have been utilized to overcome this problem but they are, in general, complex and compromise the peak power performance of the amplifier. The problems with thermal instability have been reduced in amplifier designs by using metal oxide semiconductor-field effect transistors (MOS-FET) which do not exhibit the negative temperature coefficient of the bipolar transistors. In fact, a MOS-FET exhibits a positive temperature coefficient which tends to self-limit the maximum temperature and current. The problems associated with the MOS-FET is they have heretofore been utilized in a manner requiring a significant voltage drop across the MOS-FET which, in turn, translates into a relatively high heat dissipation.

STATEMENT OF INVENTION AND ADVANTAGES

An audio amplifier circuit of this invention includes an operational amplifier stage having an input for receiving and processing an input audio signal to provide a primary audio signal. The circuit includes circuit a transducer output and a primary amplification stage for receiving the primary audio signal from the supply stage and amplifying same to provide a circuit transducer signal to the circuit transducer output. The circuit includes a power connection for supplying electrical voltage. The circuit is characterized by the primary amplification stage including at least one MOS-FET (metal oxide semiconductor-field-effect transistor) in common source connection between the power connection and the circuit transducer output.

By connecting the MOS-FET transistors in a common source connection and driving the MOS-FET from the voltage supply rail to ground, the gate voltage is not subtracted from the voltage available to the load, i.e., the transducer or speaker. Heretofore, a higher voltage was required for an equivalent output power and these voltage requirements present thermal dissipation problems. By connecting the MOS-FET output stage in the common source mode, an added gain is realized which further improves the slew rate and bandwidth of the amplifier. This high power audio amplifier exhibits ultra low distortion and is energy-efficient and unconditionally thermally stable.

FIGURE OF THE DRAWINGS

Other advantages of the present invention will be readily appreciated as the same becomes better understood by reference to the following detailed description when considered in connection with the accompanying drawing which illustrates the audio amplifier circuit of the subject invention.

DETAILED DESCRIPTION OF THE DRAWINGS

An audio amplifier circuit embodying the subject invention is shown in the drawing. The circuit provides a circuit transducer output 12 which provides a signal to the transducer or audio speaker 14 which is grounded, or common with respect to the bipolar power supply.

The system includes a conventional operational amplifier 16 which is connected in the inverting mode with its plus input 15 grounded through a resistor 18. The negative input 17 of the operational amplifier 16 is connected through a resistor 20 to the source of the audio signal or input, i. e., the output of a preamplifier. A resistor 22 interconnects the audio input to ground, acting as a divider.

A power supply or connection is included and comprises a positive voltage supply rail 24 and a negative voltage supply rail 26. As illustrated, the positive supply rail 24 is at plus 45 volts and the negative supply rail 26 is provided a minus 45 volts with respect to circuit ground.

The circuit includes a positive voltage regulator 28 interconnecting the positive voltage supply rail 24 and the operational amplifier 16 for providing a positive voltage to the operational amplifier 16. Also included is a negative voltage regulator 30 interconnecting the negative voltage supply rail 26 and the operational amplifier 16 for providing a negative voltage to the operational amplifier 16.

A P channel metal oxide semiconductor-field-effect transistor 32, referred to as a MOS-FET, is in common source connection between the power source 24 and the circuit transducer output 12. More specifically, the P channel MOS-FET 32 has a source 34 connected to the positive voltage rail 24, a drain 36 connected to the circuit transducer output 12 and a gate 38. In a similar fashion, an N channel MOS-FET 40 is in common source connection between the power source 26 and the circuit transducer output 12. The N channel MOS-FET 40 has a souce 42 connected to the negative voltage rail 26, a drain 44 connected to the circuit transducer output 12 and a gate 46.

A positive voltage level-shifting and driver stage 48 is responsive to the output of the operational amplifier 16 for establishing a voltage differential between the gate 38 of the P channel MOS-FET 32 and the positive voltage rail 24 to drive the P channel MOS-FET 32 into conduction. Similarly, a negative voltage level-shifting and driver stage 50 is responsive to the output of the operational amplifier 16 for establishing a voltage differential between the gate 46 of the N channel MOS-FET 40 and the negative voltage rail 26 to drive the N channel MOS-FET 40 into conduction.

Both of the driver stages 48 and 50 are connected to ground, as indicated at 52.

The system also includes a positive voltage divider 54 coupled between the positive voltage regulator 28 and the output 56 of the operational amplifier 16. The positive voltage divider 54 is connected to the positive driver stage 48 through the line 58. Similarly, a negative voltage divider is coupled between the negative voltage regulator 30 and the output 56 of the operational amplifier 16. The negative voltage divider 60 is connected to the negative driver stage 50 through the line 62.

A quiescent current circuit 64 is coupled between the driver stages 48 and 50 for maintaining a current flow therein when there is a zero output from the operational amplifier 16.

The circuit also optionally includes a positive auxiliary bipolar stage stepper or stepping transistor circuit 66 for providing additional amplification of the positive signal. The auxiliary amplifier stage circuit 66 inncludes a bipolar transistor 68 having its emitter 70 connected to the positive voltage rail 24 and its base 72 connected through a resistor 74 to the source 34 of the P channel MOS-FET 32. Collector 76 of the transistor 68 is connected to the transducer output 12. The auxiliary amplifier stage circuit 66 also includes the resistor 78 disposed between the connection of the gate 72 of the transistor 68 to the source of the MOS-FET 32 and the positive voltage supply rail 24.

In a similar fashion, the circuit includes a negative auxiliary stage transistor circuit 80 including a bipolar transistor 82. The base 84 of the transistor 82 is connected through a resistor 86 to the source 42 of the MOS-FET and its emitter 87 is connected to the negative voltage rail 26. The negative auxiliary amplifier stage circuit 80 also includes a resistor 88 disposed between the gate 84 of transistor 82 and the source 42 of MOS-FET 40 and the negative supply rail 26. The collector 90 of the transistor 82 is connected to the circuit transducer output 12.

The capacitor and resistor series circuit 92, which interconnects the circuit transducer output 12 and ground, prevents high frequency oscillations.

Also included is a positive side negative feedback circuit 94 interconnecting the drain 36 of the P channel MOS-FET 32 and the ground 52 side of the positive driver stage 48. Similarly, a negative side negative feedback circuit 96 interconnects the drain 44 of the N channel MOS-FET 40 and the ground side of the negative driver stage 50.

Also included is a system negative feedback circuit, generally indicated at 98, interconnecting the circuit transducer output 12 and the operational amplifier 16 on the negative input 17 side for returning a portion of the transducer output voltage to the operational amplifier 16 to cause the circuit transducer output signal to track the signal at the audio input to the operational amplifier 16.

The positive voltage regulator 28 is of the conventional type including a resistor 100 between the positive supply rail 24 and the zener diode 102 and a capacitor 104 in parallel with the zener diode 102 to ground. In a similar fashion, the negative voltage regulator 30 includes a resistor 106 in series with a zener diode 108 and its parallel capacitor 110 which are, in turn, grounded.

The positive voltage divider stage 54 includes resistors 112 and 114 in series with one another between the positive voltage regulator 28 and the output 56 of the operational amplifier 16. Similarly, the negative voltage divider 60 includes the resistors 116 and 118 in series with one another between the negative voltage regulator 30 and the output 56 of the operational amplifier 16.

The positive driver stage 48 includes an NPN bipolar transistor 120 having its base 122 d.c. coupled to the quiescent current regulating stage 64 by line 58 to the positive voltage divider 54 between the resistors 112 and 114 thereof. The collector 124 of the transistor 120 is connected through a resistor 126 to the gate 38 of the MOS-FET 32 and through a resistor 128 to the positive voltage rail 24. The emitter 130 of the NPN transistor 120 is connected through a resistor 132 to the ground 52.

The negative driver stage 50 includes a driver PNP transistor 134 having its base 136 d.c. coupled by the line 62 to the quiescent current regulating stage 64 to the negative voltage divider 60 at a position between the resistors 116 and 118 thereof. The collector 138 of the transistor 134 is connected through the resistor 140 to the gate 46 of the MOS-FET 40 and through the resistor 142 to the negative voltage rail 26. The emitter 144 of the transistor 134 is connected through the resistor 146 to the ground 52.

Thus, each driver stage 48 and 50 includes a first resistor 128 and 142 between the gate 38 and 46 of the associated MOS-FET 32 and 40 and the associated power supply rail 24 and 26. Each driver stage also includes a second resistor 126 and 142 between the gate 38 and 46 of the associated MOS-FET 32 and 40 and the associated collector 124 and 138 of the associated transistor 120 and 134. The second resistors 132 and 146 are commonly connected to the ground 52.

Each driver stage 48 and 50 also includes a zener diode 148 and 150 coupled between the associated voltage rail 24 and 26 and the gate 38 and 46 of the associated MOS-FET 32 and 40. The zener diodes 148 and 150 are 9 volts to limit the MOS-FET currents to typically 4.5 amps.

The quiescent current regulating stage 64 includes the resistors 152 and 154 in series between the bases 122 and 136 of the driver transistors 120 and 134 at the input thereto from the respective voltage divider stages 54 and 60 on lines 58 and 62, respectively. One of the transistors 154 in the quiescent current regulating stage 64 is an adjustable resistor to vary resistance thereof for adjusting the idling current so that there is always collector-emitter current in the driver stages even though there may be zero voltage at the operational amplifier output 56, creating a class AB configuration.

The negative feedback circuit 94 includes a resistor 156 and a capacitor 158 in parallel between the drain 36 of the P channel MOS-FET 32 and the emitter 130 of the driver NPN transistor 120. Similarly, the negative feedback circuit 96 includes a resistor 160 in parallel with a capacitor 162 between the drain 44 of the N channel MOS-FET 40 and the emiter 144 of the PNP transistor 134.

The resistor 132 is disposed between the connection of the negative feedback circuit 94 to the emitter 130 of the NPN transistor 120 and the ground 52. Similarly, the resistor 146 is disposed between the connection of the negative feedback circuit 96 and the emitter 144 of the PNP transistor 134 and ground 52.

The overall system negative feedback circuit 98 includes a capacitor 164 and a resistor 166 in parallel with one another and, in turn, in series with the feedback line from the transducer output 12 to the negative input 17 side of the operational amplifier 16.

A capacitor 168 is in a negative feedback loop from the output of the operational amplifier 16 to the negative input 17 side to the operational amplifier 16. The capacitor 168 shapes the high frequency response of the amplifier and affords high frequency stability to the amplifier 16. The resistance 18 between ground and the plus input 5 side of the amplifier 16 along with the resistors in the negative input 17 to the minus side of the operational amplifier 16 establish the voltage reference to ground and the gain of the overall amplifier circuit.

The voltage regulators 28 and 30 typically provide plus and minus 15 volts to the operational amplifier 16.

The resistance 170 between the output of the operational amplifier 16 and the voltage dividers 54 and 60 provides a limitation on the maximum drive current from the operational amplifier 16.

By connecting the MOS-FET transistors 120 and 132 in common source connections and driving them from the supply rails 24 and 26 down to ground, a minimum gate-source voltage is required but this voltage is not subtracted from the voltage available to the transducer output 12 or load 14. Conventional source follower circuits require a higher power supply voltage for equivalent output power and, consequently, the added voltage drops from gate to source contributes significantly to the thermal dissipation requirement.

In an exemplary circuit the components have the following values:

| RESISTORS | |
|---|---|
| 18 | 4.7K |
| 20 | 10K |
| 22 | 10K |
| 74 | 220 ohms |
| 78 | 1 ohm |
| 86 | 220 ohms |
| 88 | 1 ohm |
| 100 | 1K |
| 106 | 1K |
| 112 | 22K |
| 114 | 2.2K |
| 116 | 22K |
| 118 | 2.2K |
| 126 | 4.7K |
| 128 | 4.7K |
| 132 | 1.2K |
| 140 | 4.7K |
| 142 | 4.7K |
| 146 | 1.2K |
| 152 | 3.9K |
| 154 | 5K |
| 156 | 22K |
| 160 | 22K |
| 166 | 220K |
| 170 | 4.7K |
| CAPACITORS | |
| 104 | 10 microfarads |
| 110 | 10 microfarads |
| 158 | 100pf |
| 162 | 100pf |
| 164 | 100pf |
| 168 | 30pf |

The circuit 92 would include a 0.1 microfarad capacitor and a 10 ohm resistor. The transducer 14 would be an 8 ohm load in series with a 1 microhenry inductor.

The operational amplifier 16 may be of the type TL081 or LM318 connected in the inverting mode and powered from the zener stabilized bipolar voltage supplies 28 and 30 which include the zener diodes 102 and 108 which provide a plus or minus 15 volts supplied to the operational amplifier 16. The output voltage swing of the operational amplifier 16 is normally limited to plus or minus 10 volts peak to peak and is, therefore, amplified by a complementary pair of level-shifting transistors 120 and 134 which may be a 92PU05-npn and a 92PU55-pnp. Each of the transistors 120 and 134 operate with a voltage gain of approximately 4. To obtain absolute thermal stability of this class A stage, a minimal amount of quiescent current flows through each transistor 120 and 134, nominally 110 micro amps, which is sufficient to bias the base of each transistor 120 and 134 into conduction. The high gate input resistance of the MOS-FET transistors 32 and 40 permits the use of high value collector and emitter resistors in the level shifting amplifiers to reduce the running and quiescent current. Each MOF-FET transistor 32 and 40, respectively, a P channel Hitachi 2SJ48 and an N channel Hitachi 1SJ133, is configured to handle approximately 100 milliamps of source-drain current quiescently and up to 1.4 amps of current under full drive at which point the 1 ohm source resistors 78 and 88 exhibit a 1.4 voltage drop.

If two bipolar Darlington transistors 68 and 82 are utilized in the output stage (a TIP 147 pnp and TIP 142 npn) the transistors 68 and 82 begin to conduct only when the 1.4 volt base-emitter voltage is reached. The transistors 68 and 82 exhibit a very high gain. The maximum gain of the output stage is limited by the 22K feedback resistors 156 and 160 which yield a maximum gain of approximately 19 (e.g., resistor 132 plus resistor 156 divided by resistor 132 which is 1.2K plus 22K divided by 1.2K, which equals 19.3).

A common operational amplifier, such as TL081 with open loop unit gain bandwidth of $3.5 \times 10$ would yield a gain of 175 at $2.0 \times 10$ Hz which, when multiplied by the driver stage gain of 15, yields approximately 26.25 amplifier gain. Because of an overall 30:1 amplifier feedback ratio, the net loop gain is 1/30 of this value or nominally 87. Using a higher performance operational amplifier in the input stage, such as an LN318 with a unity gain B.W. of $5.0 \times 10$ Hz, overall net loop gains of 1250 can be realized. Such gains coupled with reasonable feedback (30dB) yield extremely low distortion at wide bandwidths. The voltage divider circuits 54 and 60 and the quiescent current regulating circuit 64 assures a very small quiescent current at all times even if their is zero output from the operational amplifier 16 so that the driver stages 48 and 50 always remain in conduction and eliminate zero crossing distortion when the signal goes from positive to negative, and vice versa. In other words, there is an overlap at the crossing of the signal going between plus and minus so that both driver stages 48 and 50 are operating at the crossing between positive and negative.

As would be appreciated, the auxiliary amplifier stages 66 and 80 only become operative at high power levels because the transistors 68 and 82 do not conduct until the base voltages thereof reach a predetermined level.

The two separate negative feedback circuits 94 and 96 allow a much higher than normal driver stage gain while maintaining high waveform fidelity in the driver stages.

In accordance with the subject invention, there is no longer a large voltage drop across the amplifying transistors, there is a higher slew rate, there is better frequency response because of the gain, there is low quiescent current, there is lower power dissipation and, therefore, less heat problems, and a smaller power supply in terms of voltage and power may be utilized to achieve outputs equivalent to higher voltage, higher power systems.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims wherein reference numerals are merely for convenience and are not to be in any way limiting, the invention may be practiced otherwise than as specifically described.

The embodiments of the invention in which an exclusive property or privilege is claimed are defined as follows:

1. An audio amplifier circuit of the AB class including differential amplifier stage (16) having an input (17) for receiving and processing an input auido signal to provide a primary audio signal, a circuit transducer output (12), a primary amplification stage for receiving said primary audio signal and amplifying same to provide a transducer signal to said circuit transducer output (12), bipolar power supply connections (24, 26) for supplying electrical current, said AB class amplifier circuit characterized by said primary amplification stage including at least two MOS-FETS (metal oxide semiconductor-field-effect transistors) (32, 40) in common source connection between said power supply connections and said circuit transducer output (12) and a level-shifting driver stage (48, 50) for driving each MOS-FET.

2. A circuit as set forth in claim 1 further characterized by said MOS-FETS (32, 40) having sources (34, 42) connected to said power supply connections (24, 26) gates (38, 46) having voltage applied thereto referenced to said power supply connections (24, 26) to establish a voltage differential between said gates (38, 46) and said sources (34, 42) to cause conduction of said MOS-FETS, said MOS-FETS (32, 42) having drains (36, 44) connected to said circuit transducer output (12).

3. A circuit as set forth in claim 2 wherein the output of said differential amplifier stage (16) is ground referenced and further characterized by each of said level-shifting driver stages (48, 50) converting output of said differential stage (16) into corresponding voltage differentials between each MOS-FET gate (38, 46) and associated power connection (24, 26) for each MOS-FET (32, 42) to operate said MOS-FETS together in class AB.

4. A circuit as set forth in claim 3 further characterized by including a system feedback stage (98) interconnecting said transducer output (12) and said input (17) to said differential amplifier input stage (16) for applying a portion of the transducer signal voltage to said input (17) to cause the amplified transducer signal to faithfully track the input audio signal.

5. A circuit as set forth in claim 3 further characterized by said power supply connection (24, 26) having a positive voltage rail (24) and a negative voltage rail (26), said differential amplifier stage (16) including an operational amplifier (16) connected having inputs (15, 17), said operational amplifier (16) having a positive supply side connected to said positive supply rail (24) and a negative supply side connected to said negative supply rail (26), through positive (28) and negative (30) voltage regulating circuits respectively.

6. A circuit as set forth in claim 5 further characterized by said MOS-FET including a P channel MOS-FET (32) having its source (34) connected to said positive supply rail (24), and an N channel MOS-FET (40) having its source (42) connected to said negative supply rail (26), said P and N MOS-FETS connected to said circuit transducer output (12), said level-shifting driver stage (48) including a NPN transistor (120) interconnecting the output of said operational amplifier (16) and said positive supply rail (24) and ground and said gate (38) of said P channel MOS-FET (32), said level-shifting driver stage (50) including a PNP transistor (134) interconnecting output of said operational amplifier (16) and said negative supply rail (26) and ground and said gate (44) of said N channel MOS-FET (40).

7. A circuit as set forth in claim 6 further characterized by including a positive side feedback circuit (94) interconnecting said drain (36) of said P channel MOS-FET (32) and the ground side of said NPN driver stage (48) and a negative side feedback circuit (96) interconnecting said drain (44) of said N channel MOS-FET (40) and the ground side of said PNP driver stage (50).

8. A circuit as set forth in claim 7 wherein said NPN driver stage (48) includes a bipolar transistor (120) having its base (122) connected to said output of said operational amplifier (16) and its collector (124) connected to said gate (38) of said P channel MOS-FET (32) to said positive supply rail (24) and its emitter (130) connected to ground (52), and said PNP driver stage (50) includes a bipolar transistor (134) having its base (136) connected to said output of said operational amplifier (16) and its collector connected to said gate (46) of said positive channel MOS-FET (40) to said negative supply rail (26) and its emitter (144) connected to ground (52).

9. A circuit as set forth in claim 8 further characterized by including a PNP bipolar transistor (68) having its emitter (70) connected to said positive supply rail (24) and its base (72) connected to said source (34) of said P channel MOS-FET (32) and its collector (76) connected to said circuit transducer output (12), and an NPN bipolar transistor (82) having its emitter (87) connected to said negative supply rail (26) and its base (84) connected to said source (42) of said N channel MOS-FET (40) and its collector (90) connected to said circuit transducer output (12).

10. An amplifier circuit of the AB class comprising: a transducer output (12), a conventional operational amplifier (16) having an audio signal input (17), a power connection including a positive supply rail (24) and a negative supply rail (26), a positive voltage regulator (28) interconnecting said positive rail (24) and said operational amplifier (16) for providing positive voltage to said operational amplifier (16), a negative voltage regulator (30) interconnecting said negative rail (26) and said operational amplifier (16) for providing negative voltage to said operational amplifier (16), a P channel MOS-FET (32) having a source (34) connected to said positive rail (24) and a drain (36) connected to said transducer output (12) and a gate (38), an N channel MOS-FET (40) having a source (42) connected to said negative rail (26) and a drain (44) connected to said transducer output (12) and a gate (46), an NPN voltage level-shifting and driver stage (48) responsive to the output

(56) of said operational amplifier (16) for establishing a voltage differential between said gate (38) of said P channel MOS-FET (32) and said positive rail (24) to drive said P channel MOS-FET (32) into conduction and isolated from being in driving relationship with said N channel MOS-FET, a PNP voltage level-shifting and driver stage (50) responsive to the output (56) of said operational amplifier (16) for establishing a voltage differential between said gate (46) of said N channel MOS-FET (40) and said negative rail (26) to drive said N channel MOS-FET (40) into conduction and isolated from being in driving relationship with said P channel MOS-FET, said driver stages (48, 50) having ground leads being connected to ground (52).

11. A circuit as set forth in claim 10 further characterized by including a positive side feedback circuit (94) interconnecting said drain (36) of said P channel MOS-FET (32) and said ground lead of said NPN driver stage (48), and a negative side feedback circuit (96) interconnecting said drain (44) of said N channel MOS-FET (40) and said ground leads of said PNP driver stage (50).

12. A circuit as set forth in claim 11 further characterized by including a system feedback circuit (98) interconnecting said circuit transducer output (12) and said operational amplifier (16) for returning a portion of the transducer output voltage to said operational amplifier (16) to cause the circuit transducer output signal to faithfully track the signal at said audio input.

13. A circuit as set forth in claim 12 further characterized by including an NPN auxiliary transistor (68) having its base (72) connected to said source (34) of said P channel MOS-FET (32) and its emitter (70) connected to said positive supply rail (24) and its collector (76) connected to said circuit transducer output (12), and a PNP auxiliary transistor (82) having its base (84) connected to said source (42) of said N channel MOS-FET (40) and its emitter (87) connected to said negative supply rail (24) and its collector (90) connected to said circuit transducer output (12).

14. A circuit as set forth in claim 12 further characterized by including a positive voltage divider (54) coupled between said positive voltage regulator (28) and the output (56) of said operational amplifier (16) and connected to said NPN driver stage (48), and a negative voltage divider (60) coupled between said negative voltage regulator (30) and the output (56) of said operational amplifier (16) and connected to said PNP driver stage (50).

15. A circuit as set forth in claim 14 further characterized by an including quiescent current regulating circuit (64) coupled between said driver stages (48, 50) for maintaining a collector-emitter through driver stages (48, 50) current flow at a zero output from said operational amplifier (16).

16. A circuit as set forth in claim 15 further characterized by said NPN driver stage (48) including a driver NPN transistor (120) having a base (122) coupled to said quiescent current regulating stage (64) and said positive voltage divider (54) and a collector (124) connected to said positive supply rail (24) to said gate (38) of said P channel MOS-FET (32) and an emitter (130) connected to ground (52), and by said PNP driver stage (50) including a driver PNP transistor (134) having a base (136) coupled to said quiescent regulating current stage (64) and said negative voltage divider (60) and a collector (138) connected to said negative supply rail (26) to said gate (46) of said N channel MOS-FET (40) and an emitter (144) connected to ground (52).

17. A circuit as set forth in claim 16 further characterized by each driver stage (48, 50) including a first resistor (128, 142) between said gate (38, 46) of the associated MOS-FET (32, 40) and the associated voltage supply (124, 26) rail and a second resistor (126, 140) between said gate (38, 46) of the associated MOS-FET (32, 40) and the associated driver transistor (120, 134), said second resistors (126, 140) being commonly connected to ground (52).

18. A circuit as set forth in claim 17 further characterized by each driver stage (48, 50) including a zener diode (148, 150) coupled between the associated voltage supply rail (24, 26) and said gate (38, 46) of the associated MOS-FET (32, 40).

19. A circuit as set forth in claim 17 further characterized by said positive side feedback circuit (94) including a capacitor (158) and resistor (156) in parallel between said drain (36) of said P channel MOS-FET (32) and said emitter (130) of the said driver NPN transistor (120) and by said negative side feedback circuit (96) including a capacitor (162) and resistor (160) in parallel between said drain (44) of said N channel MOS-FET (40) and said emitter (138) of said driver PNP transistor (134).

20. A circuit as set forth in claim 19 further characterized by said NPN driver stage (48) including a resistor (132) between said positive side feedback circuit (94) connection to said emitter (130) of said NPN transistor (120) and ground (52), and said PNP driver stage (50) including a resistor (146) between said negative side feedback circuit (96) connection to said emitter (144) of said PNP transistor (134) and ground (52).

21. A circuit as set forth in claim 20 further characterized by said system feedback circuit (98) including a resistor (166) and capacitor (164) in parallel and a ground resistor (22) connected to ground.

22. A circuit as set forth in claim 21 further characterized by including a capacitor (168) coupled between the output of said operational amplifier (16) and the input (17) to said operational amplifier (16) from said system feedback circuit.

23. A circuit as set forth in claim 22 further characterized by said quiescent current regulating circuit (64) including a pair of resistors (152, 154) in series between the inputs (58, 62) to said bases (122, 136) of said driver transistors (120, 134), one of said resistors (154) having an adjustable resistance.

24. A circuit as set forth in claim 17 further characterized by including a PNP auxiliary transistor (68) having its base (72) connected through a resistor (74) to said source (34) of said P channel MOS-FET (32) and its emitter (70) connected to said positive voltage supply rail (24) and its collector (76) connected to said circuit transducer output (12) and resistor (78) disposed in the connection between said source (34) of said P channel MOS-FET (32) and said positive voltage supply rail (24), and by including an NPN auxiliary transistor (82) having its base (84) connected through a resistor (86) to said source (42) of said N channel MOS-FET (40) and its emitter (87) connected to said negative voltage supply rail (26) and its collector (90) connected to said transducer output (12) and a resistor (88) disposed in the connection between said source (42) of said N channel MOS-FET (40) and said negative voltage supply rail (26).

25. An amplifier circuit comprising: a circuit of the AB class, transducer output (12), an operational amplifier (16) having an audio signal input (17) and output referenced to ground, a power connection including a positive voltage supply rail (24) and a negative voltage supply rail (26), a positive voltage regulator (28) interconnecting said positive rail (24) and said operational amplifier (16) for providing positive voltage to said operational amplifier (16), a negative voltage regulator (30) interconnecting said negative rail (26) and said operational amplifier (16) for providing positive voltage to said operational amplifier (16), a P channel MOS-FET (32) having a source (34) connected to said positive rail (24) and a drain (36) connected to said circuit transducer output (12) and a gate (38), an N channel MOS-FET (40) having a source (42) connected to said negative rail (26) and a drain (44) connected to said circuit transducer output (12) and a gate (46), a driver NPN bipolar transistor (120) having a base (122) coupled to the output of said operational amplifier (16) and a collector (124) coupled to said gate (38) of said P channel MOS-FET (32) to said positive voltage rail (24) and an emitter (36) connected to ground (52) for shifting the ground referenced voltage to establish a voltage differential between said gate (38) of said P channel MOS-FET (32) and said positive voltage rail (24) to drive said P channel MOS-FET (32) into conduction and isolated from being in driving relationship with said N channel MOS-FET, a driver PNP bipolar transistor (134) having a base (136) coupled to the output of said operational amplifier (16) and a collector (138) coupled to said gate (46) of said N channel MOS-FET (40) to said negative voltage rail (26) and an emitter (144) connected to ground (52) for shifting the ground referenced voltage to establish a voltage differential between said gate (46) of said N channel MOS-FET (40) and negative voltage rail (26) to drive said N channel MOS-FET (40) into conduction and isolated from being in driving relationship with said P channel MOS-FET.

26. A circuit as set forth in claim 25 further characterized by including a positive side feedback circuit (94) interconnecting said drain (36) of said P channel MOS-FET (32) and said emitter (130) of said NPN transistor (120) and a negative side feedback circuit (96) interconnecting said drain (44) of said N channel MOS-FET (40) and said emitter (144) of said PNP transistor (134).

27. A circuit as set forth in claim 25 further characterized by including a system feedback circuit interconnecting said circuit transducer output (12) and the input (17) to said operational amplifier (16) for returning a portion of the circuit transducer output voltage to said operational amplifier (16) to cause the circuit transducer output signal to faithfully track the signal at said audio input.

* * * * *